(12) United States Patent
Heinrich et al.

(10) Patent No.: US 12,732,205 B2
(45) Date of Patent: Sep. 8, 2026

(54) ANALOG-TO-DIGITAL CONVERSION DEVICE

(71) Applicant: Aptiv Technologies (2) S.à r.l., Luxembourg (LU)

(72) Inventors: Markus Heinrich, Wiehl (DE); Guillaume Tournabien, Saint Soupplets (FR)

(73) Assignee: Aptiv Technologies AG, Schaffhausen (CH)

(*) Notice: Subject to any disclaimer, the term of this patent is extended or adjusted under 35 U.S.C. 154(b) by 140 days.

(21) Appl. No.: 18/467,694

(22) Filed: Sep. 14, 2023

(65) Prior Publication Data

US 2024/0097695 A1 Mar. 21, 2024

(30) Foreign Application Priority Data

Sep. 15, 2022 (EP) .................................... 22195910

(51) Int. Cl.
*H03M 1/12* (2006.01)
*H03M 1/18* (2006.01)

(52) U.S. Cl.
CPC .................................... *H03M 1/18* (2013.01)

(58) Field of Classification Search
CPC .......... H03M 1/183; H03M 1/12; H03M 1/18; H03M 1/186; H03M 1/187; H03M 1/0604; H03M 1/124; H03M 1/185; H03M 1/38; H03M 1/46; H03M 1/002; H03M 1/007; H03M 1/1295; H03M 1/06; H03M 1/0607; H03M 1/0609; H03M 1/0629; H03M 1/0695; H03M 1/0836; H03M 1/1009; H03M 1/1019; H03M 1/1057; H03M 1/1071; H03M 1/1215; H03M 1/122; H03M 1/123; H03M 1/129; H03M 1/144; H03M 1/145; H03M 1/164; H03M 1/167;
(Continued)

(56) References Cited

U.S. PATENT DOCUMENTS 5,343,200 A * 8/1994 Matsui .................. H03M 1/187 341/139
5,808,575 A * 9/1998 Himeno ............. H03M 1/0863 341/139

(Continued)

FOREIGN PATENT DOCUMENTS

WO 2021248350 A1 12/2021

OTHER PUBLICATIONS

Extended European Search Report for EP Application No. 22195910.9 mailed Mar. 7, 2023, 9 pages.

*Primary Examiner* — Linh V Nguyen
(74) *Attorney, Agent, or Firm* — Miller Johnson

(57) ABSTRACT

An analog-to-digital converter conversion device includes a variable gain adjuster configured to adjust a level of an analog input signal with a variable gain. The analog-to-digital converter conversion device includes an analog-to-digital converter configured to convert the adjusted analog input signal to a digital output signal. The analog-to-digital converter conversion device includes a classification circuit configured to output a corresponding classification information of the analog input signal based on the level of the analog input signal. The variable gain adjuster is configured to set a gain value of the variable gain corresponding to the classification information.

17 Claims, 5 Drawing Sheets

(58) Field of Classification Search
CPC ...... H03M 1/181; H03M 1/188; H03M 1/361; H03M 1/362; H03M 1/365; H03M 1/462; H03M 1/468; H03M 1/60; H03M 3/394; H03M 3/424; H03M 3/438; H03M 3/452; H03M 3/462; H03M 3/486; H03M 3/49; H03M 3/492
USPC ......................... 341/118–121, 132, 139, 155
See application file for complete search history.

(56) References Cited

U.S. PATENT DOCUMENTS 5,844,512 A * 12/1998 Gorin .................. H03M 1/0629 341/139
6,046,692 A * 4/2000 Yamashiro ............ H03M 1/462 709/200
6,353,405 B1 * 3/2002 Yang .................. H03M 1/1028 341/118
6,707,492 B1 * 3/2004 Itani ...................... H04N 25/78 348/222.1
8,816,886 B1 * 8/2014 Warner ............... H03M 1/1057 341/120
9,231,751 B1 * 1/2016 Lin ....................... H04L 7/0037
9,998,136 B1 * 6/2018 Wu ....................... H03M 1/183
10,608,655 B1 * 3/2020 Li ....................... H03M 1/1057
11,057,045 B2 7/2021 Averay
12,199,626 B2 * 1/2025 Nam ..................... H03M 1/162
2007/0120721 A1 5/2007 Caduff et al.
2010/0019840 A1 * 1/2010 Takahashi ............. H03F 1/0227 330/3
2011/0026651 A1 2/2011 Bhukania et al.
2011/0140778 A1 * 6/2011 Cho ..................... H03G 3/3078 330/129
2012/0104235 A1 5/2012 Sumi et al.
2015/0120026 A1 4/2015 Zhang
2022/0190840 A1 * 6/2022 Moon ................... H03M 1/164
2024/0154592 A1 * 5/2024 Howlett ............... H03G 3/3089

* cited by examiner 300
200
100
201
Sin
210
Sin'
221
224
220
222
223
Sin_i or Sin'_i
230
231
232
233
T
Sin_j* or Sin'_j*
240
241
242
243
$V_{ref}$
Sout
244A
Sout
244B
Gain code
202
Sout + gain code
250
251A
251B
251C
$V_{ref}/2$
$V_{ref}/8$
$V_{ref}/16$

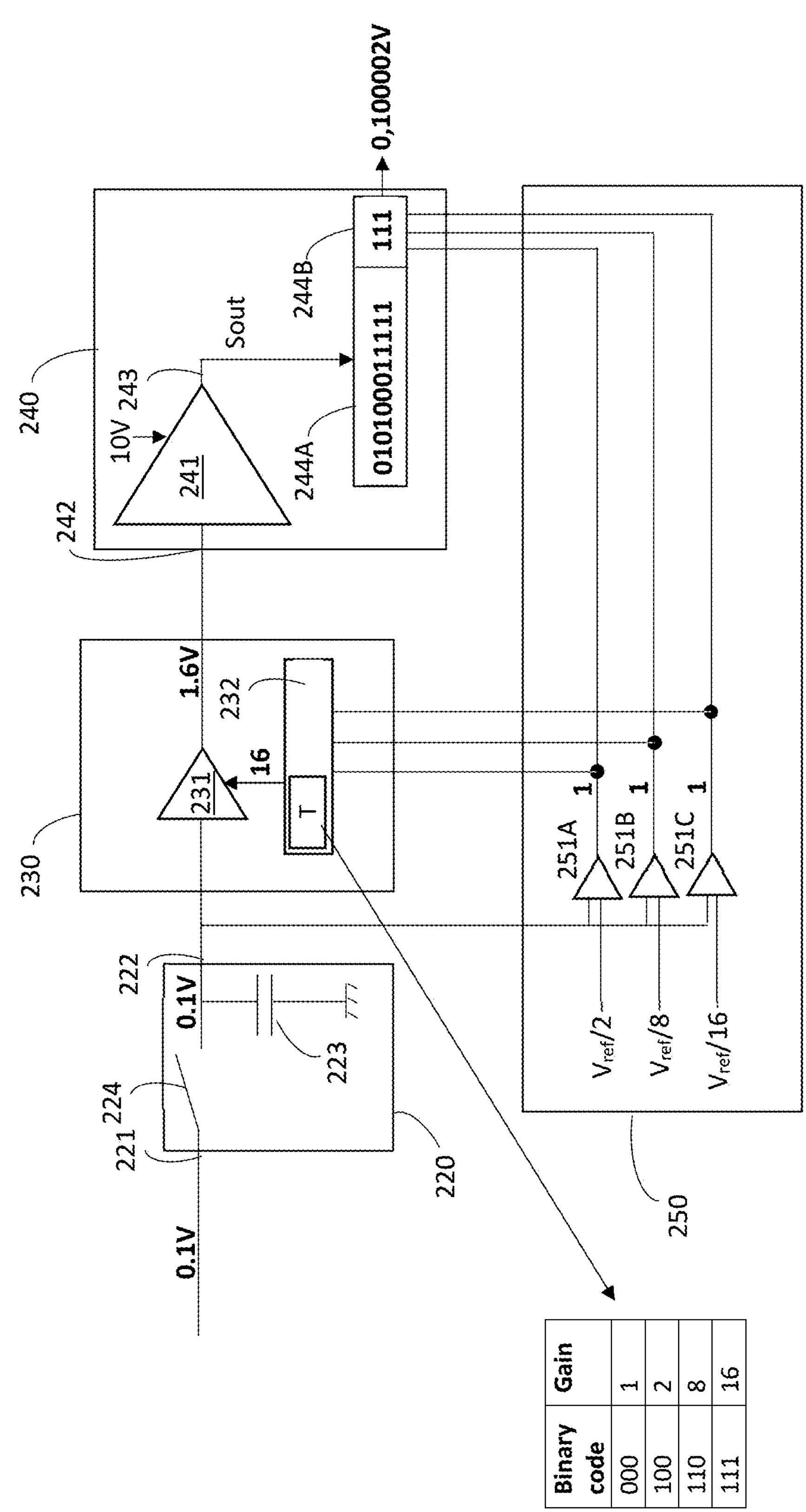
| Binary code | Gain |
|---|---|
| 000 | 1 |
| 100 | 2 |
| 110 | 8 |
| 111 | 16 |

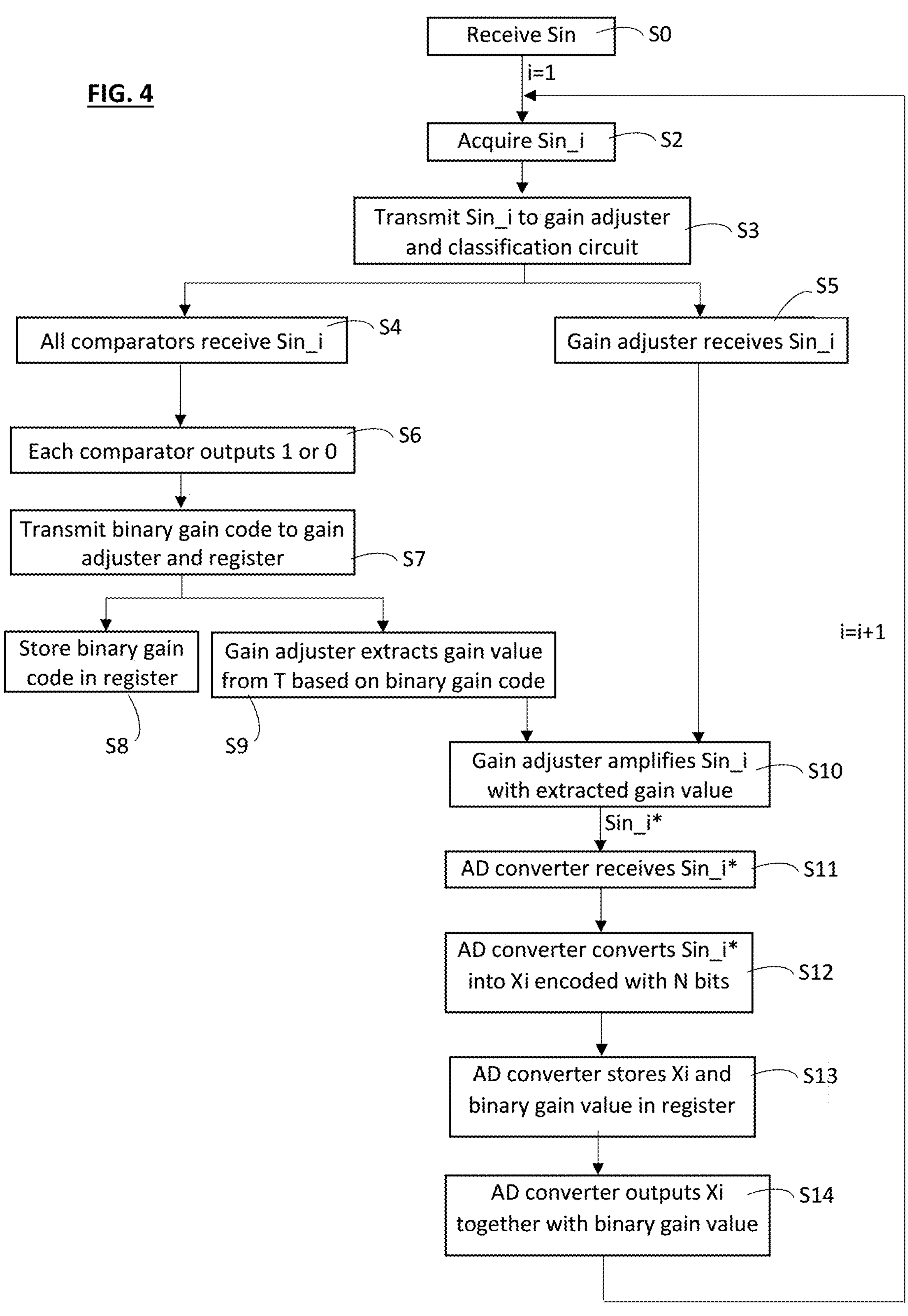
FIG. 4
Receive Sin
S0
i=1
Acquire Sin_i
S2
Transmit Sin_i to gain adjuster and classification circuit
S3
All comparators receive Sin_i
S4
Gain adjuster receives Sin_i
S5
Each comparator outputs 1 or 0
S6
Transmit binary gain code to gain adjuster and register
S7
Store binary gain code in register
S8
Gain adjuster extracts gain value from T based on binary gain code
S9
i=i+1
Gain adjuster amplifies Sin_i with extracted gain value
S10
Sin_i*
AD converter receives Sin_i*
S11
AD converter converts Sin_i* into Xi encoded with N bits
S12
AD converter stores Xi and binary gain value in register
S13
AD converter outputs Xi together with binary gain value
S14

ANALOG-TO-DIGITAL CONVERSION DEVICE

CROSS-REFERENCE TO RELATED APPLICATIONS

This application claims priority to EP 22195910, filed Sep. 15, 2022, the entire disclosure of which is incorporated by reference.

FIELD

The present disclosure relates to analog-to-digital converters.

BACKGROUND

An analog-to-digital converter (ADC) device 500 is configured to convert an analog input signal Sin, for example a voltage signal, into a digital output signal Sout. The system may include an input that receives the analog input signal Sin, an adaptation block 510 to adapt the analog input signal Sin, and an ADC 540 including a conversion block 541 and an output register 544, as illustrated in FIG. 1. The conversion block 541 may have a sample acquirer, not represented, for acquiring successive samples or analog values of the analog input signal Sin, after adaptation by the block 510 of the analog input signal Sin.

The ADC 540 is an electronic device configured to output a numerical value encoded with N bits, that is representative of an analog value in input.

The ADC 540 has a reference voltage Vref, and the input voltage should cover between 0V and Vref. In other words, the allowed voltage range of the ADC 540 is set between 0V and Vref.

The adaptation block 510 has the role of adapting, if needed, a voltage level of the analog input signal Sin with a predetermined fixed ratio so that a maximal analog value of the analog input signal Sin does not exceed the reference voltage Vref of the ADC 540. For example, the adaptation block 510 includes a voltage divider.

The resolution Q of the converter, also called "step" or "quantum", represents the smallest variation of voltage in input that increases, or decreases, the numerical value at the output by 1, and can be expressed by the following expression:

$$Q = \frac{V_{ref}}{2^N - 1}$$

where

Q is the resolution expressed in volts (V);

$V_{ref}$ is the reference voltage of the converter;

N is the number of conversion bits of the converter.

For example, an ADC device with a reference voltage $V_{ref}$ of 10V and 12 bits of conversion can encode an analog input value to one in 4096 different quantization levels or discrete values ($2^{12}$=4096) and has a resolution Q of 10V/$4095^2$=2.4 mV.

The analog input signal may be provided at the output of an electronic or electrical component or device, for example a switch, and be likely to vary from a very low voltage level to a very high voltage level. For example, a switch may be configured to operate with a nominal electrical current of 21 amperes and to protect itself, in case of short-circuit, when the current goes up to 160 amperes. Therefore, the ADC device 500 should be capable of converting analog input voltage values corresponding to the nominal current of about 20 A and to a highest current of 160 A, with good precision in all cases.

Let's consider an analog input voltage value equal to 0.1 V that is received by the ADC 540 as input. This analog input value of 0.1 V is included within the allowed range of voltage of the ADC 540, but the ADC 540 only uses one or two bits from the 12 bits available to convert this low analog input value. For low voltage values in input, the resolution of the ADC 540 is poor.

Furthermore, if the analog input value is around the quantum (2.4 mV in the above example), the numerical value at the output of the ADC 540 is very imprecise.

SUMMARY

To solve the above problems, a programmable gain amplifier 530, shown in FIG. 1, can be used to boost the voltage level of the analog input signal, when this voltage level is too low compared to the reference voltage $V_{ref}$ of the converter 540. This gain is programmed by hardware and software, based on the output of the conversion block 541 stored in the register 544, as represented in FIG. 1. The hardware and software for programming the gain may include a processor and an application, running on this processor, to process the numerical values at the output of the conversion block 541.

To determine the optimal gain values of the variable gain over time, a plurality of analog input values of the analog input signal Sin first need to be converted into numerical output values. For example, let's consider an analog input signal that is very low and cannot be properly detected by the ADC 540. In that case, the gain is increased step-by-step by an interactive process, from an initial gain value that is either prefixed or random, until the analog input signal Sin is correctly detected. At each iteration of the process, the gain is increased, and a numerical value corresponding to an analog input value of the analog input signal Sin is read at the output of the conversion block 541. These multiple iterations of the process result in a certain latency to determine the optimal gain values. Consequently, there is a delay between the moment when the analog input signal is initially received by the ADC device 500 and the moment when numerical output values can effectively be read at the output of the ADC device 500.

In certain circumstances, it is desired to convert the analog input value instantaneously or in real-time, without delay. For example, in case of short-circuit, the current at the output of a switch sharply increases and it is needed to detect it quickly and precisely. It is desired to determine the output numerical value corresponding to the analog input value without delay.

The present disclosure concerns a device of analog-to-digital conversion, ADC, including a variable gain adjuster configured to adjust a level of an analog input signal with a variable gain, and an analog-to-digital converter configured to convert the adjusted analog input signal to a digital output signal. The ADC device further includes a classification circuit configured to output a corresponding classification information of the analog input signal based on the level of the analog input signal. The variable gain adjuster is configured to set a gain value of the variable gain corresponding to the classification information.

In the present disclosure, the gain value of the variable gain is programmed based on a classification information of the analog input signal. This classification information is produced by a classification circuit that directly operates on the analog input signal. Thanks to that, the gain value can be programmed instantly, are almost instantly, and automatically based on the analog input signal.

Advantageously, the classification information including a binary gain code, the analog-to-digital converter and the classification circuit are both configured to concomitantly store a digital value resulting from the conversion of the analog input signal and the binary gain code, in at least one output register. In one variation, the digital value and the binary gain code are concomitantly stored in a same output register, for example in two respective parts of the output register. Thanks to that, the output register stores the digital output value corresponding to an analog input value together with the binary gain code used to perform the analog to digital conversion.

In one variation, the classification circuit is configured to output the classification information corresponding to the analog input signal automatically and in real time. The classification may automatically output the classification information, without need to be requested or controlled, in real time upon receiving the analog input signal.

In one variation, the variable gain adjuster is configured to select the gain value from a plurality of predetermined selectable gain values of the variable gain based on the classification information, according to a correspondence table containing the plurality of selectable gain values of the variable gain and, for each selectable gain value, a corresponding classification information.

In a particular variation, the classification circuit may include a plurality of comparators respectively configured to compare the analog input signal to different reference values and to output binary values that are dependent on whether the analog input signal is above or below the corresponding reference value, the classification information including a binary gain code includes a sequence of the binary values at the output of the plurality of comparators.

The comparators may be for example voltage comparators.

In one variation, the device may further includes a sample acquisition block configured to acquire successive samples of the analog input signal and to concomitantly transmit each sample of the analog input signal to the variable gain adjuster and to the classification circuit.

In one variation, the variable gain adjuster is configured to adjust a voltage level of the analog input signal above half of a reference voltage value of the analog-to-digital converter.

In one variation, the analog input signal being an electrical signal, the ADC device further includes an adaptation module configured to adapt the voltage level of the analog input signal to the reference voltage value of the analog-to-digital converter, so that a predetermined maximal voltage value of the analog input signal does not exceed the reference voltage value of the analog-to-digital converter.

Advantageously, the classification circuit may be an analog electronic circuit configured to operate on analog signals. In one variation, the classification circuit may be exclusively hardware. The classification circuit may be free of software or digital means and include only hardware and cabling.

The present disclosure also concerns:

- a system including a first device configured to output an analog signal and a second ADC device as above defined configured to convert the analog signal at the output of the first device into a digital signal;
- an integrated circuit including the ADC device or the system, as above defined;
- a vehicle including one or more ADC devices, or one or more systems, or one or more integrated circuits, as above defined.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIG. 3 shows an illustrative example of conversion of an analog input value into a numerical output value performed by the ADC device of FIG. 2.

FIG. 4 illustrates a method of converting an analog input signal into a digital output signal, corresponding to an operation of the ADC device of FIG. 2, according to one variation.

In the drawings, reference numbers may be reused to identify similar and/or identical elements.

DETAILED DESCRIPTION

Figure 1:
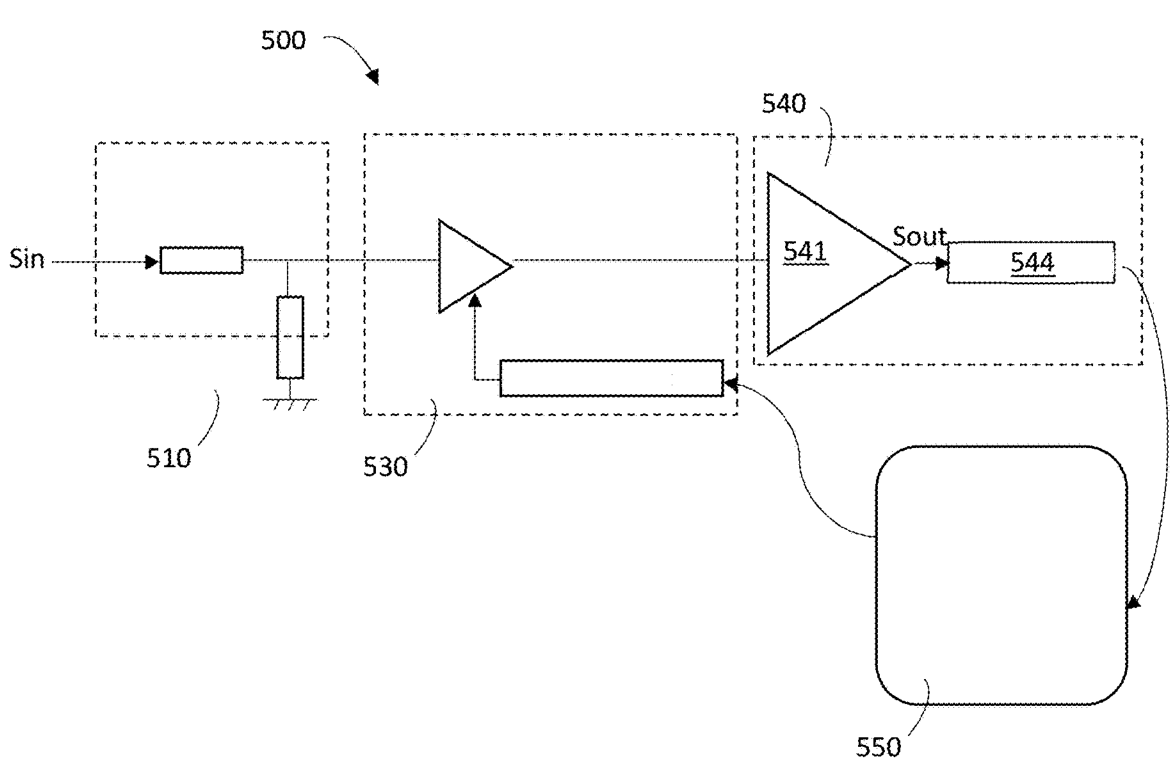
FIG. 1 shows a device of analog-to-digital conversion of the prior art.
Figure 2:
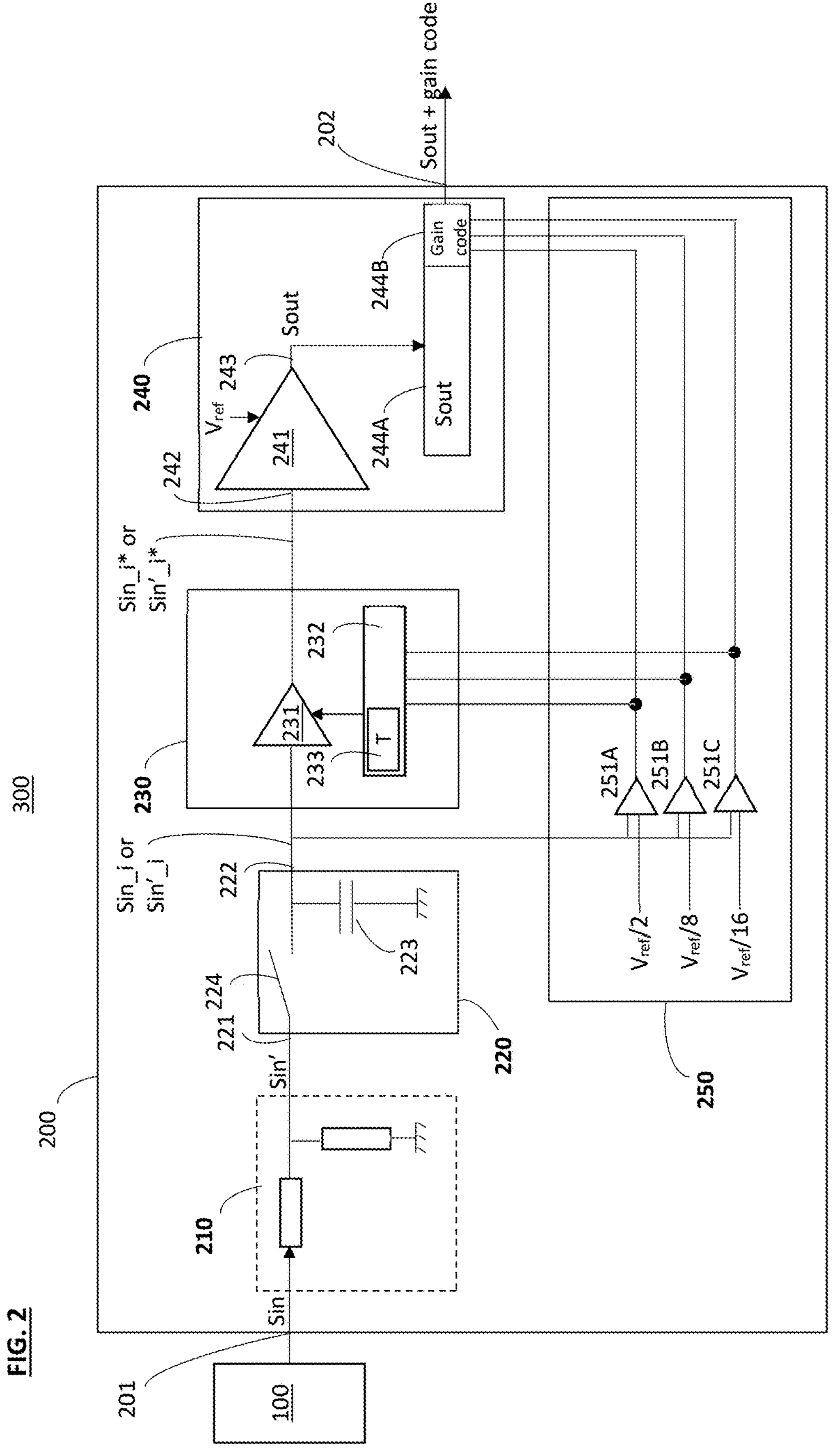
FIG. 2 shows a system including a first device and a second ADC device, according to one variation.

The present disclosure concerns a system 300 including a first device 100 configured to output an analog signal and a second device that is an analog-to-digital conversion (ADC) device configured to convert the analog signal from the output of the first device 100 into a digital output signal. As an illustrative and non-limitative example, the first device 100 may be a switch, a current sensor, a voltage supervisor, a temperature sensor, a RF power signal detector, etc. FIG. 2 illustrates an example of the system 300.

The ADC device 200 is configured to receive an analog input signal Sin through an input interface 201 and to output a digital signal Sout encoded with N bits through an output interface 202. The digital output signal Sout includes numerical or digital values that are representative of analog values in input.

In one variation, the analog input signal Sin is an electrical signal, for example a voltage signal. The analog input signal Sin is a time-varying signal.

The ADC device 200 includes an analog-to-digital converter (ADC) 240, a variable gain adjuster 230, and a classification circuit 250.

The ADC device 200 may further include a sample acquisition block 220 configured to acquire successive samples of the analog input signal.

The ADC device 200 may also include an adaptation block 210 for adapting or preprocessing the analog input signal Sin before processing by the ADC 240, as explained later.

The ADC 240 has the role of converting the analog input signal Sin, optionally preprocessed Sin', into a digital output signal Sout. More precisely, the ADC 240 is configured to convert analog input values or samples of the analog input signal Sin, optionally preprocessed Sin', into numerical output values.

The ADC 240 has a reference voltage $V_{ref}$, also currently referred as VCC. In operation, an input voltage of the ADC 240 should be included between 0V and $V_{ref}$. In other words, the allowed range of analog input voltage values of the ADC 240 is included between 0V and $V_{ref}$.

The ADC 240 has a conversion block 241 with an input interface 242 to receive analog input values, or samples, of the analog input signal Sin, optionally preprocessed Sin', and an output interface 243 to output a digital output signal, Sout, including numerical values encoded with N bits, that are representative of analog values in input.

A resolution Q of the ADC 240 can be expressed by the following expression:

$$Q = \frac{V_{ref}}{2^N - 1}$$

where

Q is the resolution expressed in volts (V);

$V_{ref}$ is the reference voltage of the converter;

N is the number of conversion bits of the converter.

Q represents the smallest variation of voltage in input that increases, or decreases, the numerical value at the output by 1.

The ADC 240 may further include an output register 244. The output register 244 is configured to store the numerical values of the digital output signal Sout at the output of the conversion block 241, in a first part 244A of the output register 244. Alternatively, the output register could be external to the ADC 240.

A maximal voltage value expected at the output of the first device 100 is generally known, for example based on a datasheet of a manufacturer of the first device 100 or by testing the first device 100. If the maximal voltage at the output of the first device 100 exceeds the reference voltage $V_{ref}$, or is very small compared to $V_{ref}$, an adaptation of the level or amplitude or voltage of the input analog signal Sin may be necessary to either lower or increase the voltage level of the analog input signal Sin prior to transmission to the ADC 240.

The input of the adaptation block 210 may be connected to the input interface 201 of the ADC device 200. The adaptation block 210 is configured to adapt or adjust the level or voltage of the analog input signal Sin to the reference voltage value $V_{ref}$ of the ADC 240, so that the adapted analog input signal at the output of the adaptation block 210 is readable by the ADC 240. The analog input signal Sin that has been adapted by the adaptation block 210 is referred as Sin'.

In one variation, the adaptation block 210 is used to fix a maximal voltage value of the adapted analog input signal Sin'. The maximal voltage value of Sin' should not exceed the reference voltage value $V_{ref}$ of the ADC 240, and should not be too small compared to the reference voltage value $V_{ref}$. In one variation, the adaptation block 210 is a circuit configured to produce an output voltage Vout that is derived from the input voltage Vin by a fixed ratio or value: Vout=ρ·Vin, where ρ is a fixed predetermined ratio or value, with 0<ρ

Mathematically, the adaptation block 210 applies the fixed ratio ρ to the analog input signal Sin, or multiplies the analog input signal Sin by the fixed ratio ρ: Sin'=ρ·Sin.

As an illustrative and non-limitative example, the adaptation block 210 may include a voltage divider having two impedances or resistive elements, as shown in FIG. 2, that applies a ratio $\rho<1$. In another example, the adaptation block 210 could be an amplifier that applies a ratio $\rho>1$, in case the input signal Sin has a small maximal voltage, for example 1 V max.

The adaptation block 210 may include other components, for example a filter, such as a high pass filter, an integrator, a band pass filter, etc. This block could also be active to adjust the input signal Sin to Sin' with a maximal voltage that does not exceed Vref.

The adaptation block 210 is optional. If the expected maximal voltage of the analog input signal Sin does not exceed $V_{ref}$, the voltage level of the analog input signal Sin does not need to be adapted.

In another variation, the adaptation block may be external to the ADC device 200.

In another variation, the adaptation of the signal at the output of the first device 100 may be performed externally, by a separate device interposed between the first device 100 and the ADC device 200.

The sample acquisition block 220 may be interposed between the adaptation block 210 and the gain adjuster 230. In other words, the input of the sample acquisition block 220 is connected to the output of the adaptation block 210 and its output is connected to the input of the gain adjuster 230. The role of the sample acquisition block 220 is to acquire analog samples or input values of the analog input signal Sin, optionally adapted or preprocessed Sin' by the adaptation block 210.

In one variation, the sample acquisition block 220 has an input 221, an output 222, a sample storage component, such as a capacitance 223, and a switch 224. The capacitance 223 may be connected between a connection point interposed between of the input 221 and output 222 and the ground. The switch 224 may be connected between the input 221 and the output 222, for example between the input 221 and the connection point, as shown in FIG. 2. The switch 224 may be configured to be cyclically turned on and off to connect and disconnect the conducting path between the input 221 and the output 222. In operation, when the switch 224 is turned on during a fixed period of time, it connects the conducting path between the input 221 and the output 222, and the sample acquisition block 220 acquires an analog sample of the analog input signal Sin, optionally adapted Sin', that is temporarily stored in the capacitance 223. Then the switch 224 is turned off and thus disconnects the conducting path between the input 221 and the output 222, and the sample acquisition block 220 outputs the acquired analog sample through the output 222.

The output 222 of the sample acquisition block 220 is connected to an input of the gain adjuster 230 and to the classification circuit 250. In operation, the sample acquisition block 220 concomitantly transmits each sample Sin_i of the analog input signal Sin, or optionally each sample Sin' _i of the adapted analog input signal Sin', i being a sample index, to the variable gain adjuster 230 and to the classification circuit 250, as input. In this way, the gain adjuster 230 and the classification circuit 250 concomitantly receive each of the successive samples Sin_i or Sin' _i of the analog input signal Sin, after each sample acquisition.

The variable gain adjuster, or amplifier, 230 has the role of adjusting the voltage or level or amplitude of the analog input signal Sin, optionally adapted or preprocessed Sin', with a variable gain to optimize the resolution of the analog-to-digital conversion by the ADC 240. The gain value of the variable gain may dynamically vary over time depending on a voltage of the analog input signal Sin, optionally adapted Sin'.

In one variation, the gain values of the variable gain may be equal or more than 1. In that case, the role of the variable gain adjuster 230 is to boost or increase the voltage of the analog input signal Sin, optionally adapted Sin', when it is too low compared to the reference voltage $V_{ref}$ of the ADC 240.

In one variation, the variable gain adjuster 230 may be configured to adjust voltage of the analog input signal Sin, optionally adapted Sin', between half of the reference voltage value $V_{ref}$ and the reference voltage value $V_{ref}$.

The variable gain adjuster 230 has an amplifier 231 and a gain programming block 232.

The gain programming block 232 is configured to determine and set or program successive gain values based on a classification information from the classification circuit 250. The determination of the gain values based on the classification information provided by the classification circuit 250 is performed dynamically, in real-time, and automatically, as explained later in more detail.

In one variation, the gain values of the variable gain are selected from a set of prefixed or predetermined selectable gain values based on the classification information. The gain programming block 232 may be configured to determine or program or apply a gain value from the set of predetermined selectable gain values of the variable gain, based on the classification information and according to a correspondence table T containing the plurality of selectable gain values of the variable gain and, for each selectable gain value, a corresponding classification information.

Optionally, in a particular variation, the gain adjuster 230 may store in memory 233 the correspondence table T.

In one variation, the selectable gain values of the table T are greater than or equal to 1.

The amplifier 231 is responsible for amplifying each sample or analog input value Sin_i, or Sin'_i, of the analog input signal Sin, optionally adapted Sin', with the corresponding gain value programmed by the gain programming block 232. The corresponding gain value is the gain value determined based on the sample are analog input value Sin_i, or Sin'_i, as explained later in more detail.

The samples or analog input values Sin_i, or Sin'_i, of the analog input signal Sin, optionally adapted Sin', may be classified into different classes based on a voltage of these samples Sin_i, or Sin'_i. More precisely, the allowed voltage range of the ADC 240 between 0V and $V_{ref}$ may be subdivided into a plurality of non-intersecting sub-ranges corresponding to different respective classes. The role of the classification circuit 250 may be to determine, for each sample Sin_i, or Sin'_i, of the analog input signal Sin, optionally adapted Sin', a classification information representative of the class or sub-range which the sample Sin_i, or Sin'_i, of the analog input signal Sin, optionally adapted Sin', belongs to.

The classification circuit 250 has the function of providing or outputting a corresponding classification information of the analog input signal Sin, optionally adapted Sin'. The classification information of the analog input signal Sin, optionally adapted Sin', is produced by the classification circuit 250 based on the voltage or level of the analog input signal Sin, optionally adapted Sin', as explained later in more detail.

The classification circuit 250 may be an analog electronic circuit configured to operate on analog signals. In one variation, the classification circuit 250 may be exclusively hardware. In other words, it may be free of software or digital means.

In one variation, the classification circuit 250 includes a plurality of comparators 251A, 251B, . . . , such as voltage comparators. A voltage comparator is an electronic device that compares an input voltage to a known reference voltage and changes its output state depending on whether the input is above or below the reference voltage. Each comparator 251A, 251B, . . . has:

- a first input connected to the output 222 of the sample acquisition block 220;
- a second input connected to a corresponding reference voltage point;
- an output connected to the gain adjuster 230, more precisely to the gain programming block 232, and to a second part 244B of the output register 244.

The comparators 251A, 251B, . . . , are configured to compare analog input values or samples of the analog input signal Sin, optionally adapted Sin', provided by the sample acquisition block 220 to different respective reference voltage values, and to output respective binary values, namely '0' or '1', that are dependent on whether the analog input value is above or below the corresponding reference voltage value.

Figure 5:
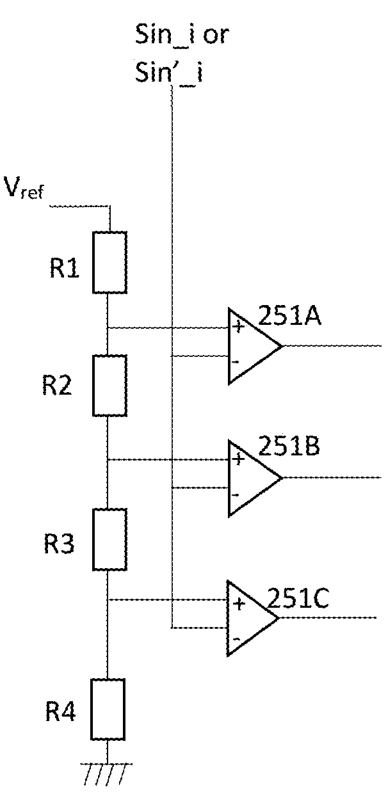
FIG. 5 illustrates an example of a circuit to generate reference voltages at the input of voltage comparators.

For example, the respective reference voltages at the input of the comparators 251A, 251B, . . . are created by a plurality of resistive elements R1, R2, . . . connected in series between a circuit point at the reference voltage $V_{ref}$ and the ground, as represented in FIG. 5. Each comparator 251A, 251B, . . . has an input connected at a connection point within the set of resistive elements R1, R2, . . . connected in series, providing its reference voltage, and another input that receives the analog input signal Sin, optionally adapted Sin'.

For each analog input value or sample of the analog input signal Sin, optionally adapted Sin', received in input by the classification circuit 250, namely by the comparators 251A, 251B, . . . , the classification information at the output of the classification circuit 250 may include a binary gain code corresponding to a sequence of the binary values at the output of the plurality of comparators 251A, 251B, . . . arranged in a determined order.

In operation, the binary gain code produced at the output of the classification circuit 250 for each analog input value or sample of the analog input signal Sin, optionally adapted Sin', is provided to the gain programming block 232 of the gain adjuster 230 and to the second part 244B of the register 244.

The method of converting an analog input signal Sin into a digital output signal Sout, corresponding to the operation of the ADC device 200, will now be described, according to one variation.

In a step S0, the analog input signal Sin is received through the input interface 201 of the ADC device 200.

Let's consider that the predetermined maximal voltage of the analog input signal Sin does not exceed $V_{ref}$. In that case, no adaptation of the voltage of the analog input signal may be needed.

In another variation, the predetermined maximal voltage value of the analog input signal Sin may exceed the reference voltage $V_{ref}$ of the ADC 240. In that case, in a step S1, not represented in FIG. 4, the analog input signal Sin may be preprocessed or adapted by the adaptation block 210 by applying a fixed ratio ρ to the input voltage signal Sin. The value of the ratio ρ is determined so that the maximal voltage of the adapted input voltage signal Sin' at the output of the adaptation block 210 does not exceed $V_{ref}$.

The method includes a plurality of steps S2 to S14, that are iteratively executed over an index 'i' of sampling. Let's consider that the index i is initially set to 1.

In the step S2, a sample Sin_i of the analog input signal Sin is acquired by the acquisition block 220. The acquisition block 220 temporarily stores the input signal Sin in the capacitance 223 to acquire the sample Sin_i, when the switch 224 is turned on during a fixed period of time (i.e., when the switch 224 connects the conducting path between the input 221 and the output 222). The sample Sin_i is considered to be an image of the analog input signal Sin.

Then, in the step S3, the acquired sample or analog input value Sin_i is concomitantly provided to the gain adjuster 230 and to the classification circuit 250, when the switch 224 is turned off (i.e., when the switch disconnects the conducting path between the input 221 and the output 222).

The sample or analog input value Sin_i is concomitantly received by the plurality of voltage comparators 251A, 251B, . . . , in input, in the step S4, and by the gain adjuster 230, in the step S5. The steps S4 and S5 are simultaneous.

In the present example illustrated in FIG. 2, that is only illustrative and non-limitative, the classification circuit 250 includes three voltage comparators 251A, 251B, 251C. The voltage reference values of the voltage comparators 251A, 251B, 251C are respectively equal to $V_{ref}/2$, $V_{ref}/8$ and $V_{ref}/16$. For example, if the reference voltage value $V_{ref}$ of the ADC 240 is equal to 10 V, the voltage reference values of the comparators 251A, 251B, 251C are respectively equal to 2.5V, 0.625V, 0.3125V.

After the step S4, in the step S6, each voltage comparator 251A, 251B, 251C compares the received sample or analog input value Sin_i to its respective reference voltage value $V_{ref}/2$, $V_{ref}/8$, $V_{ref}/16$, and outputs a binary value, 0 or 1, that is dependent on whether the voltage, or level, of the sample Sin_i is above or below the reference voltage value $V_{ref}/2$, $V_{ref}/8$ and $V_{ref}/16$. For example,

- when the sample or analog input voltage value Sin_i is below the voltage reference value of the comparator, the output of the comparator is 1; and
- when the sample or analog input voltage value Sin_i is equal or more than the voltage reference value of the comparator, the output of the comparator is 0.

The voltage comparators 251A, 251B, 251C concomitantly output respective binary values. The sequence of binary values at the output of the comparators 251A, 251B, 251C, arranged in a determined order, form a binary gain code that constitutes a classification information related to the sample or analog value Sin_i of the analog input signal Sin.

The voltage comparators 251A, 251B, 251C instantly, or almost instantly, in other words in real-time, output the binary values upon reception of the sample or analog input value Sin_i.

The classification circuit 250 is configured to output the classification information including for example the binary gain code automatically and in real-time. It means that the classification circuit 250 outputs the classification information without any external instruction or command or request while the input analog signal is received. This allows to adjust the gain value used by the gain adjuster automatically and in real-time.

Then, in the step S7, the binary gain code produced at the output of the voltage comparators 251A, 251B, 251C is instantly or almost instantly, in other words in real-time, provided to the gain adjuster 230 and to the register 244. The binary gain code produced at the output of the voltage comparators 251A, 251B, 251C is automatically and instantly, or almost instantly, transmitted to the gain adjuster 230 through cabling or hardware connections between the outputs of the comparators 251A, 251B, 251C and the gain adjuster 230. In the same manner, the output binary gain code of the comparators 251A, 251B, 251C is automatically and instantly, or almost instantly, transmitted to the second part 244B of the register 244 through cabling or hardware connections between the outputs of the comparators 251A, 251B, 251C and the register 244.

In the step S8, the binary gain code received by the register 244 is stored in the second part 244B of the register 244.

In the step S9, the gain programming block 232 of the gain adjuster 230 receives the binary gain code from the comparators 251A, 251B, 251C, then selects and extracts one of the selectable gain values from the correspondence table T based on the received binary gain code. More precisely, the gain programming block 232 searches for the received binary gain code in the stored correspondence table T, and retrieves the gain value associated with the received binary gain code from the correspondence table T.

In the illustrative example of FIG. 4, the correspondence table T of the gain adjuster 230 is as follows:

| Binary gain code | Gain |
|---|---|
| 000 | 1 |
| 100 | 2 |
| 110 | 8 |
| 111 | 16 |

After reception of the sample or analog input value Sin_i in the step S5 and selection of the gain value in the step S9, the gain adjuster 230 amplifies the sample or analog input value Sin_i with the selected gain value, in the step S10. Mathematically, the analog voltage input value Sin_i is multiplied by the selected gain value. Thus, the analog input voltage value or sample Sin_i of the analog input signal Sin is increased or amplified by the selected gain value. If the selected gain value is equal to 1, the analog input value Sin_i remains unchanged after adjustment by the gain adjuster 230.

In the illustrative example of FIG. 3, the voltage analog input value or sample Sin_i is equal to 0.1 V. As a result, the binary gain code produced by the classification circuit 250 is equal to 111, and the gain value selected by the gain adjuster 230 is equal to 16. Thus, the gain value of 16 is applied to the analog voltage value 0.1 V to obtain the adjusted analog voltage value 1.6 V at the output of the gain adjuster 230.

The analog voltage input value Sin_i that has been adjusted by the gain adjuster 230 is referred as Sin_i*.

In the step S11, the adjusted input signal sample Sin_i* at the output of the gain adjuster 230 is provided to the input of the ADC 240.

In the step S12, the AD conversion block 241 converts the adjusted analog input value Sin_i* into a numerical output value $X_i$ encoded with N bits.

In the step S13, the AD conversion block 241 outputs the numerical output value Xi and stores it into the first part 244A of the output register 244.

The step S8 of storing the binary gain code into the register 244 and the step S13 of storing the numerical or digital output value Xi are performed simultaneously or almost simultaneously, so that the register 244 concomitantly stores the numerical value Xi, in its part 224A, together with the corresponding binary gain code that has been used to select the gain value used to adjust the analog input value Sin_i, in its part 244B. In this way, the digital value Xi resulting from the conversion of the analog input signal and the binary gain code corresponding to the gain value applied prior to converting the analog input signal are concomitantly stored in the same output register 244.

Alternatively, the digital value Xi and the corresponding binary gain code could be stored synchronously and/or concomitantly in at least two different registers linked to or associated with each other.

Then, the numerical output value Xi together with the binary gain value are provided at the output of the ADC 240, in the step S14.

Then, the index i is incremented by 1 and a new cycle including the steps S2 to S13 is performed on the next sample or analog input value Sin_i+1 of the analog input signal Sin.

The steps S2 to S14 are iteratively executed to acquire successive samples or analog input values Sin_i of the analog input signal Sin, optionally adapted Sin', and convert the successive analog input values Sin_i into numerical output values Xi, with i=1, 2, . . . .

The steps S3 to S14 are performed instantly, or almost instantly, and automatically at each sampling of the analog input signal Sin, optionally adapted Sin', in other words for each sample Sin_i of the analog input signal. The actions of the classification circuit 250 are exclusively performed on analog input values or samples of the analog input signal and through hardware means, which allows to derive the gain value directly from the analog input signal without need of software for processing the numerical output values to program the gain. The gain value of the variable gain is automatically adjusted to have the best resolution in the ADC 240 on each sampling of the analog input signal Sin, optionally adapted Sin'.

The ADC device 200 samples the analog input signal Sin, optionally adapted Sin', to get successive analog input values of the analog input signal. With the present disclosure, the ADC 240 can output the correct numerical value corresponding to the analog input signal only after a single sampling of the analog input signal.

Instead of storing the binary gain value in the output register of the ADC 240, the binary gain value could be transmitted to another device external to the ADC device 200.

The present disclosure also concerns:

an integrated circuit including the ADC device 200;

an integrated circuit including the first device 100 and the ADC device 200.

The ADC device 200 may be included in a vehicle. Therefore, the present disclosure also concerns a vehicle including one or more ADC devices 200, or one or more systems 300, or one or more integrated circuits as above defined.

The phrase “at least one of A, B, and C” should be construed to mean a logical (A OR B OR C), using a non-exclusive logical OR, and should not be construed to mean “at least one of A, at least one of B, and at least one of C.” The phrase “at least one of A, B, or C” should be construed to mean a logical (A OR B OR C), using a non-exclusive logical OR.

The invention claimed is:

1. An analog-to-digital conversion device having a reference voltage and configured to operate within an allowed range of analog input voltage values between 0 V and the reference voltage, the analog-to-digital conversion device comprising:

an adaptation module configured to adapt a voltage level of an analog input signal to a reference voltage value, wherein the adaptation module includes:
a first resistor electrically connected to an input and an output of the adaptation module, and
a second resistor electrically connected to the first resistor and a ground;

a sample acquisition block configured to acquire successive samples of the adapted analog input signal from the adaptation module, wherein the sample acquisition block includes:
a switch electrically connected to an input and an output of the sample acquisition block, and
a capacitor electrically connected to the switch and the ground;

a variable gain adjuster configured to adjust a level of the adapted input signal with a variable gain based on the samples received from the sample acquisition block;

an analog-to-digital converter configured to convert the adjusted analog input signal to a digital output signal; and a classification circuit configured to output a corresponding classification information of the analog input signal based on the level of the analog input signal, wherein:
the classification information is representative of a sub-range from a plurality of non-intersecting sub-ranges that subdivide the allowed range of analog input voltage values,
the variable gain adjuster is configured to set a gain value of the variable gain corresponding to the classification information,
the classification information includes a binary gain code,
the analog-to-digital converter stores a digital value resulting from the conversion of the analog input signal to a first part of an output register, and
the classification circuit stores the binary gain code in a second part of the output register.

2. The analog-to-digital conversion device of claim 1 wherein the classification circuit is configured to output the classification information corresponding to the analog input signal automatically and in real time.

3. The analog-to-digital conversion device of claim 1 wherein:

a correspondence table includes:
a plurality of selectable gain values of the variable gain, and
for each of the plurality of selectable gain values, a corresponding classification value; and the variable gain adjuster is configured to select the gain value of the variable gain from the correspondence table according to the classification information.

4. The analog-to-digital conversion device of claim 2 wherein the variable gain adjuster is configured to select the gain value from a plurality of selectable gain values of the variable gain based on the classification information, according to a correspondence table containing the plurality of selectable gain values of the variable gain and, for each selectable gain value, a corresponding classification information.

5. The analog-to-digital conversion device of claim 1 wherein:

the classification circuit includes a plurality of comparators respectively configured to compare the analog input signal to different reference values and to output binary values that are dependent on whether the analog input signal is above or below a corresponding reference value, and the binary gain code includes a sequence of the binary values at the output of the plurality of comparators.

6. The analog-to-digital conversion device of claim 2 wherein:

the classification circuit includes a plurality of comparators respectively configured to compare the analog input signal to different reference values and to output binary values that are dependent on whether the analog input signal is above or below a corresponding reference value, and the binary gain code includes a sequence of the binary values at the output of the plurality of comparators.

7. The analog-to-digital conversion device of claim 5 wherein the comparators are voltage comparators.

8. The analog-to-digital conversion device of claim 1 wherein the sample acquisition block is configured to concomitantly transmit each sample of the analog input signal to the variable gain adjuster and to the classification circuit.

9. The analog-to-digital conversion device of claim 1 wherein the variable gain adjuster is configured to adjust the voltage level of the analog input signal above half of the reference voltage value of the analog-to-digital converter.

10. The analog-to-digital conversion device of claim 1 wherein:

the analog input signal is an electrical signal; and the adaptation module is configured to adapt the voltage level of the analog input signal to the reference voltage value of the analog-to-digital converter, so that a maximal voltage value of the analog input signal does not exceed the reference voltage value of the analog-to-digital converter.

11. The analog-to-digital conversion device of claim 1 wherein the classification circuit is an analog electronic circuit configured to operate on analog signals.

12. The analog-to-digital conversion device of claim 11 wherein the classification circuit is exclusively hardware.

13. An integrated circuit comprising the analog-to-digital conversion device of claim 1.

14. A vehicle comprising the integrated circuit of claim 13.

15. A vehicle comprising the analog-to-digital conversion device of claim 1.

16. A system comprising:

a first device configured to output an analog signal; and the analog-to-digital conversion device of claim 1, wherein the analog-to-digital conversion device is configured to receive the analog signal at the output of the first device as the analog input signal.

17. A vehicle comprising the system of claim 16.

* * * * *